(12) United States Patent
Radecker

(10) Patent No.: US 7,052,970 B2
(45) Date of Patent: May 30, 2006

(54) METHOD FOR PRODUCING INSULATOR STRUCTURES INCLUDING A MAIN LAYER AND A BARRIER LAYER

(75) Inventor: Joerg Radecker, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/798,863

(22) Filed: Mar. 12, 2004

(65) Prior Publication Data

US 2004/0241929 A1 Dec. 2, 2004

(30) Foreign Application Priority Data

Mar. 14, 2003 (DE) ................ 103 11 312

(51) Int. Cl.
*H01L 21/76* (2006.01)
(52) U.S. Cl. ............. 438/435; 438/400; 438/424
(58) Field of Classification Search ......... 257/374, 257/510, 511, 512, 513, 514, 515, 516, 517, 257/518, 519, 520, 521, 522; 438/435
See application file for complete search history.

(56) References Cited

U.S. PATENT DOCUMENTS

| | | | |
|---|---|---|---|
| 6,033,970 A | 3/2000 | Park | |
| 6,037,018 A | 3/2000 | Jang et al. | |
| 6,057,209 A | 5/2000 | Gardner et al. | |
| 6,744,113 B1 * | 6/2004 | Kuroi et al. | |

FOREIGN PATENT DOCUMENTS

| | | |
|---|---|---|
| DE | 102 28 691 A 1 | 3/2003 |
| EP | 0 936 665 A1 | 8/1999 |

* cited by examiner

*Primary Examiner*—Nathan J. Flynn
*Assistant Examiner*—Kevin Quinto
(74) *Attorney, Agent, or Firm*—Slater & Matsil, L.L.P.

(57) ABSTRACT

In order to produce insulator structures (8), insulator trenches (21) with aspect ratios of greater than 4:1 are introduced into a semiconductor substrate (1) from a substrate surface (10) and filled with an insulator filling (3). The insulator filling (3) is formed from a plurality of portions (31, 32, 33, 34) which are deposited successively in situ in an HDP/CVD process chamber in the course of an HDP/CVD deposition process. A main layer (33) is provided made from fluorine-doped silicon oxide with good filling properties. A barrier layer (32) is formed directly before the deposition of the main layer (33), said barrier layer preventing an outgassing of the fluorine from the fluorine-doped silicon oxide (33), an interaction of the fluorine with the semiconductor substrate (1) and a formation of defect areas (6) with oxide of low quality in the area of the insulator filling (3). The barrier (32) makes it possible to form nondegrading p-channel transistors (73) in the area of the substrate surface (10). An additional layer (31) and a termination layer (34) respectively effect an adaptation and linking of the main layer (33) and of the barrier layer (32) to preceeding and succeeding process steps.

34 Claims, 5 Drawing Sheets

METHOD FOR PRODUCING INSULATOR STRUCTURES INCLUDING A MAIN LAYER AND A BARRIER LAYER

BACKGROUND

1. Field

The invention relates to methods for producing insulator structures in a semiconductor substrate, in which insulator trenches are introduced into the semiconductor substrate from a substrate surface of the semiconductor substrate, and furthermore relates to an insulator structure.

2. Background Information

In semiconductor process technology, dimensions of semiconductor devices fabricated on or in a semiconductor substrate (wafer) are continually being reduced in order to increase a yield of semiconductor devices per wafer, and to reduce a response time or a power consumption of the semiconductor devices.

In the course of processing semiconductor devices in a wafer, a sequence of process steps for shaping insulator structures is effected in a process module. For instance, insulator structures isolate interconnects arranged in an identical metallization plane electrically from one another (intermetal dielectric, IMD) or insulate conductive sections formed below a substrate surface of the semiconductor substrate from one another (shallow trench isolation, STI). In this case, the conductive sections are doped sections of the semiconductor substrate that are formed, for example, as source/drain regions of transistors, or as structures made of conductive material that are introduced into the semiconductor substrate, such as connecting lines and electrodes of capacitor structures made of doped polysilicon.

A customary insulator material for fabricating the insulator structures is silicon oxide. In this case, the silicon oxide is preferably deposited by means of a deposition process based on a high density plasma (high density plasma, chemical vapor deposition, HDP/CVD). Silicon oxide layers of high conformity are produced by means of the HPD/CVD deposition process. Insulator structures formed from such silicon oxide layers have a high density and a high quality.

Toward smaller dimensions, insulator structures between interconnects of a metallization plane are increasingly subject to a requirement that a capacitive coupling of adjacent interconnects, which initially rises with a smaller distance, be kept small by the selection of an insulator material having low permittivity (low-k dielectric). U.S. Pat. No. 6,375,744 (Murugesh et al.), for instance, discloses methods that reduce the permittivity of the deposited insulator material by the addition of fluorine-containing additives (fluorine-based additives) during the deposition process and the partial incorporation thereof into the insulator material. In this case, it is assumed that additions of electronegative fluorine, for instance, reduce the polarizability of an Si—O—F structure produced in this way and an Si—O—F structure therefore has a lower permittivity or dielectric constant than a silicon oxide without additions. For silicon oxide layers to which fluorine is added, the terms fluorinated silicate glass, FSG) and fluorine-doped silicon oxide film are customary in this context, while in order to distinguish conceptually from this, the term undoped silicon oxide is used if the silicon oxide emerges from chemical precursor compounds (precursors) without halogen components.

Insulator structures embodied in the semiconductor substrate generally emerge from a process of filling insulator trenches introduced into the semiconductor substrate from a substrate surface. Since structures of active areas formed in the semiconductor substrate are often better scaleable with regard to planar dimensionings than with regard to a vertical dimensioning with respect to the substrate surface, there is an increase in the aspect ratio AR between a depth of the insular trenches and an opening width of the insulator trenches at the substrate surface. It is foreseeable that insulator trenches having an aspect ratio AR>5:1 will be necessary for minimum feature sizes of less than 100 nanometers.

A defect-free, complete (void-free) filling of the insulator trenches is made more difficult as the aspect ratio increases. With undoped silicon oxide, using conventional HDP/CVD deposition processes, insulator trenches can be filled essentially in a defect-free manner only up to an aspect ratio of AR<4.

U.S. Pat. No. 6,372,291 (Hua et al.), for instance, discloses that adding fluorine or a fluorine compound during the deposition process positively influences the filling operation and enables a defect-free, directional filling from the trench bottom even of insulator trenches having an aspect ratio AR>4:1 to AR<7:1. It is assumed in this case that the fluorine in the form of free radicals forms an etching component, which counteracts a growth of material in the area of the trench openings and thus an accretion of the insulator trenches in the region of the trench openings before a complete filling of a lower trench region (sputtering). Consequently, the insulator trenches are filled directionally from the trench bottom (bottom-up fill).

If an insulator trench introduced in a semiconductor substrate is filled in the manner described, then an interaction disadvantageously occurs between fluorine that is outgassing or outdiffusing from the doped silicon oxide and the material of the semiconductor substrate, typically monocrystalline silicon. On account of the interaction, a low-quality oxide arises in the insulator structure along an interface with the semiconductor substrate. The low-quality oxide has, in comparison with the insulator material, a lower etching resistance that is altered with respect to customary etching processes.

FIG. 1 diagrammatically illustrates a cross-section of two insulator trenches 21 introduced into a semiconductor substrate 1 on both sides of a web 22 formed by the semiconductor substrate 1. A residual section of a protective layer 11, which is necessary for a previous processing, is arranged on the web 22. The insulator trenches 21 are filled with an insulator filling 3, which is deposited in the course of an HDP/CVD deposition process and extends beyond a substrate surface 11. Facets 30 which are typical of the HDP deposition process form above the webs 22. The material of the insulator filling 3 is fluorine-doped silicon oxide. Fluorine outgasses or outdiffuses from the insulator filling 3. At the interface with the web 22, defect areas 6 form on account of an interaction of the fluorine with the silicon of the semiconductor substrate. The silicon oxide of the insulator filling 3 is of low quality in the defect areas 6.

Usually, after the filling of the insulator trenches, insulator material deposited above the substrate surface in the course of the HDP/CVD deposition process is planarized, for instance by means of a chemical mechanical polishing method (CMP). The low-quality oxide in the defect areas is also attacked during subsequent etchings. The insulator structure is consequently caused to recede below the substrate surface in the defect areas.

After the removal of the insulator material from the sections arranged above the substrate surface, the insulator structure formed in the insulator trench has gaps at the interfaces with the semiconductor substrate. The gaps may be filled with conductive materials in subsequent process steps, for instance during the formation of conductive structures, and consequently be the cause of short circuits.

A short circuit attributable to a defect area 6 is illustrated diagrammatically in plan view in FIG. 2. The defect area 6 extends in an insulator trench 21 along a web 22 made of crystalline silicon. An insulator material filling the insulator trenches 21 is caused to recede as far as a substrate surface. Two gate conductor structures formed in each case from a gate conductor (GC) are arranged on the substrate surface and, by way of example, form mutually insulated word lines for driving transistors 73 formed in active areas 7 (AA). For this purpose, the gate conductor was deposited in a real fashion and patterned by means of an etching step. Sections of the gate conductor bearing on the substrate surface between the gate conductor structures 72 were removed during the etching step. Residual portions of the gate conductor remain in the defect area 6 below the substrate surface and consequently short-circuit the two gate conductor structures 72.

It is furthermore known that defect areas with low-quality oxide do not arise if fluorine-doped silicon oxide is deposited on a thin silicon nitride layer (nitride liner) covering the semiconductor substrate. No perceptible interaction of fluorine with the monocrystalline silicon of the semiconductor substrate occurs in this case.

FIG. 3 diagrammatically illustrates a cross section—adapted from a scanning electron microscopy (SEM) recording—through a structure comprising webs 22 and insulator trenches 21 in a semiconductor substrate 1, said structure being covered with a nitride liner 12. The trenches have a depth of 570 nm with a width of about 135 nm. The aspect ratio AR of the insulator trenches 21 is greater than 4:1. No defect areas are discernible. The insulator trenches 21 are filled without any defects.

SUMMARY

In the processes and structures described above, it is disadvantageous that p-channel transistors that are formed using customary technology in sections of the semiconductor substrate which are covered by a silicon nitride liner applied before the HDP/CVD deposition process have a comparatively high degradation rate in comparison with such p-channel transistors that are not formed on sections of the semiconductor substrate covered with a silicon nitride liner beforehand. As an aspect of the invention, a method is disclosed for producing insulator structures by filling insulator trenches introduced into a semiconductor substrate, in which insulator trenches with a high aspect ratio are filled reliably and completely and a functionality of semiconductor devices that are subsequently formed in the semiconductor substrate remains ensured. Moreover, an insulator structure is disclosed that ensures a functional integrity of the semiconductor devices subsequently formed in the semiconductor substrate, in particular of p-channel transistors.

Accordingly, a method is disclosed for producing insulator structures in a semiconductor substrate. Insulator trenches are introduced into the semiconductor substrate from a substrate surface of the semiconductor substrate. The insulator trenches are at least partially filled with a main layer made of an additive-doped insulator material in the course of an HDP deposition process based on a high density plasma. A barrier layer, which blocks an interaction of the additive with the semiconductor substrate, is produced before a deposition of the main layer in the course of the HDP deposition process.

An insulator structure in a semiconductor substrate is also described. The structure includes a main layer, which has been formed from halogen-doped silicon oxide and has emerged from an HDP deposition process. Also featured is a barrier layer, which isolates the main layer from the semiconductor substrate and is formed in direct connection with the main layer by means of an HDP deposition process and blocks an interaction of the halogen with the semiconductor substrate.

The invention is explained in more detail below with reference to diagrammatic drawings on the basis of preferred exemplary embodiments of the methods according to the invention.

BRIEF DESCRIPTION OF THE DRAWINGS

The invention is explained in more detail below with reference to the appended drawings, in which, in detail.

DETAILED DESCRIPTION

Figure 1:
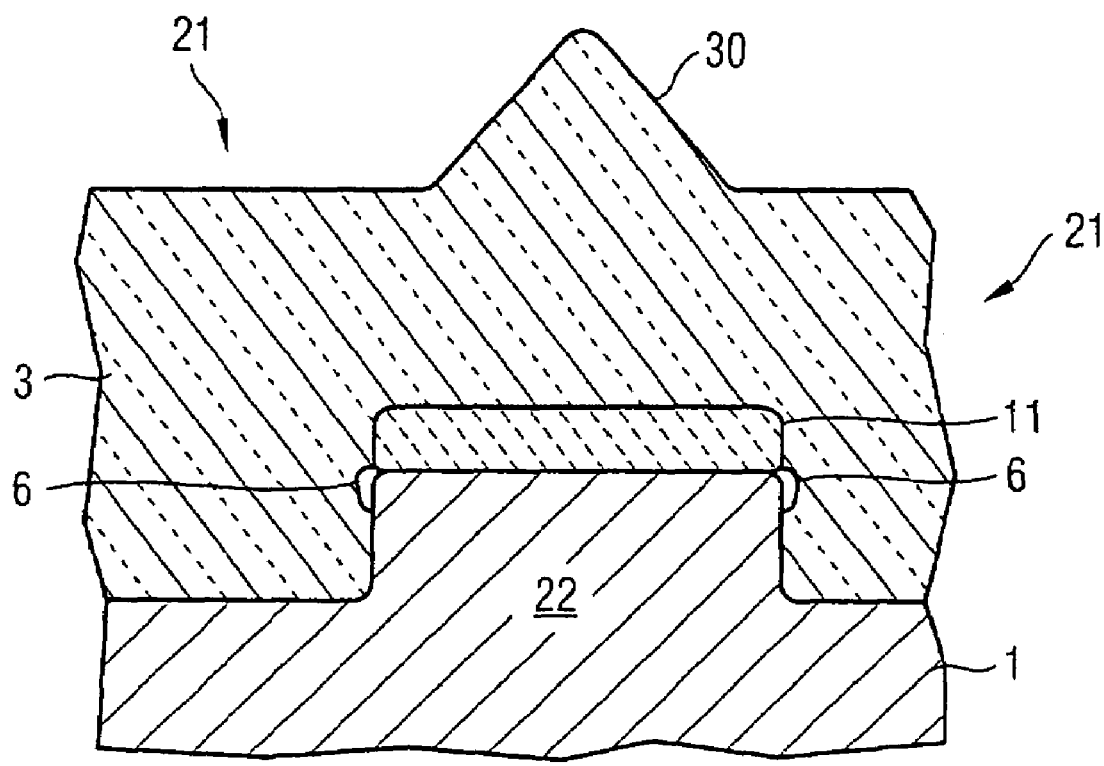
FIG. 1 illustrates a cross section, adapted from an SEM recording and true to scale, through a first insulator structure, processed according to a first known method, in a first process stage.
Figure 2:
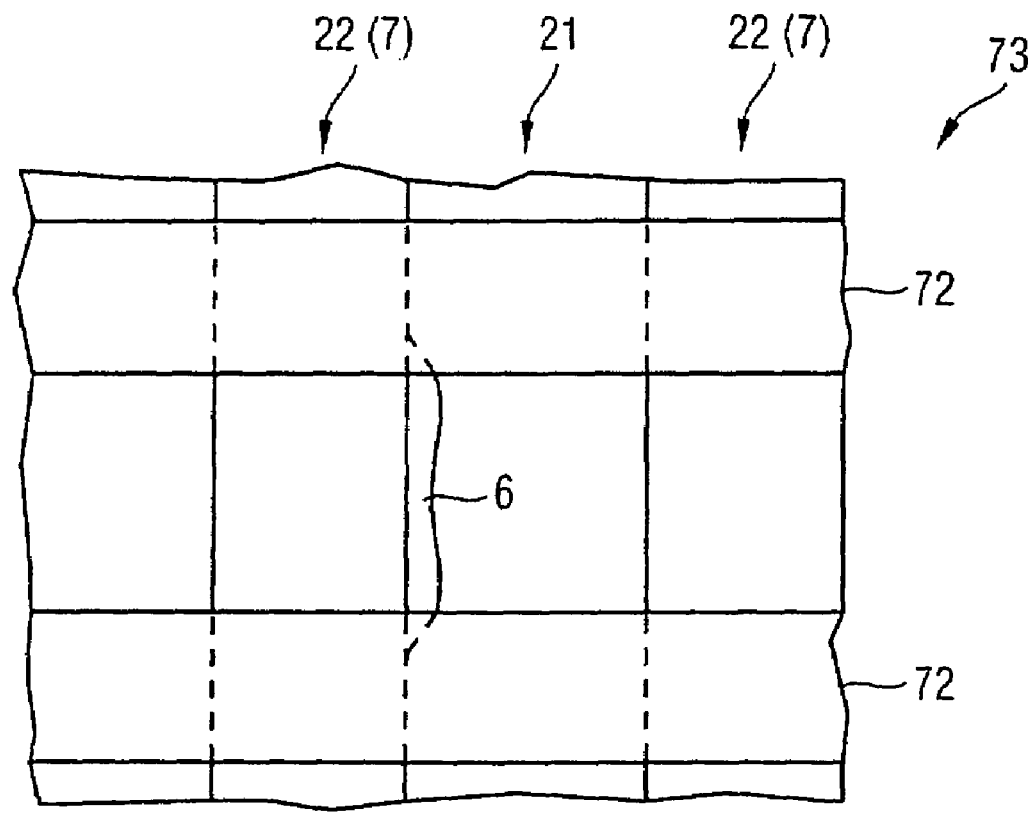
FIG. 2 is a plan view, also adapted from an SEM recording and true to scale, of the insulator structure processed according to the first known method, in a second process stage.
Figure 3:
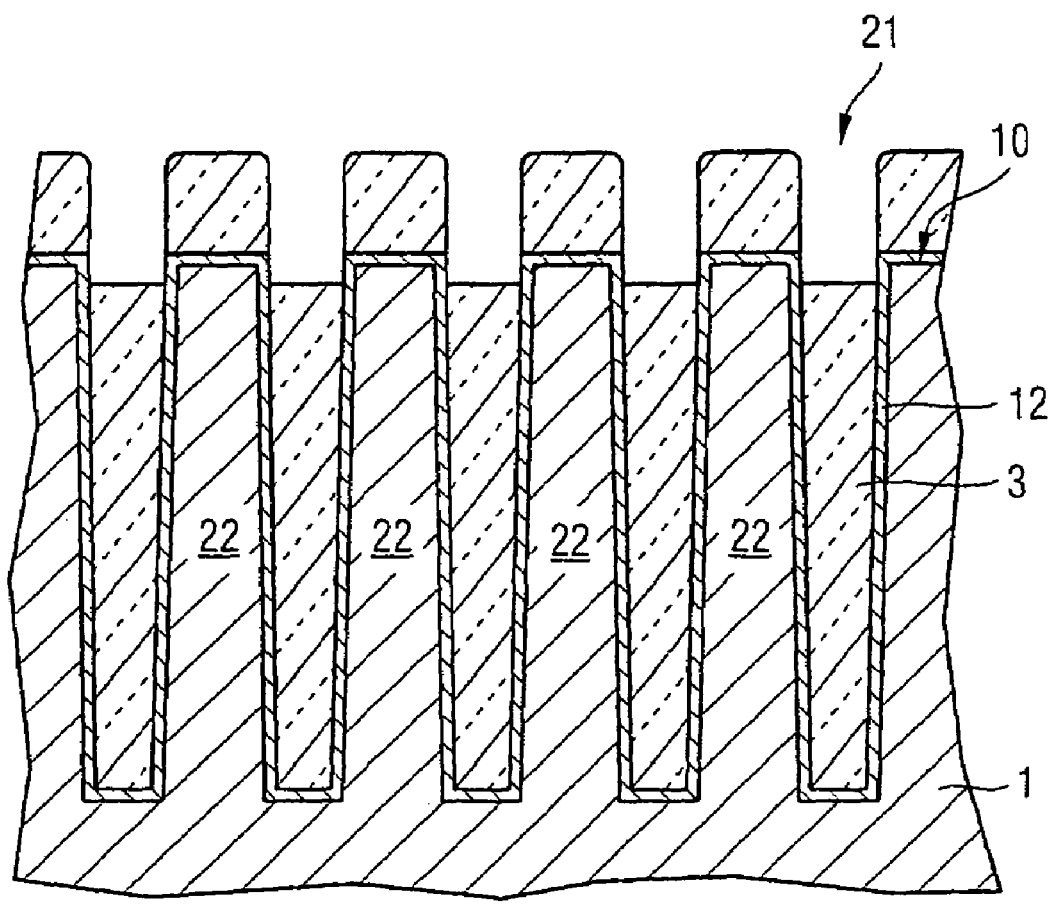
FIG. 3 illustrates a cross-section, adapted from an SEM recording and true to scale, through an insulator structure processed according to a second known method.
Figure 4:
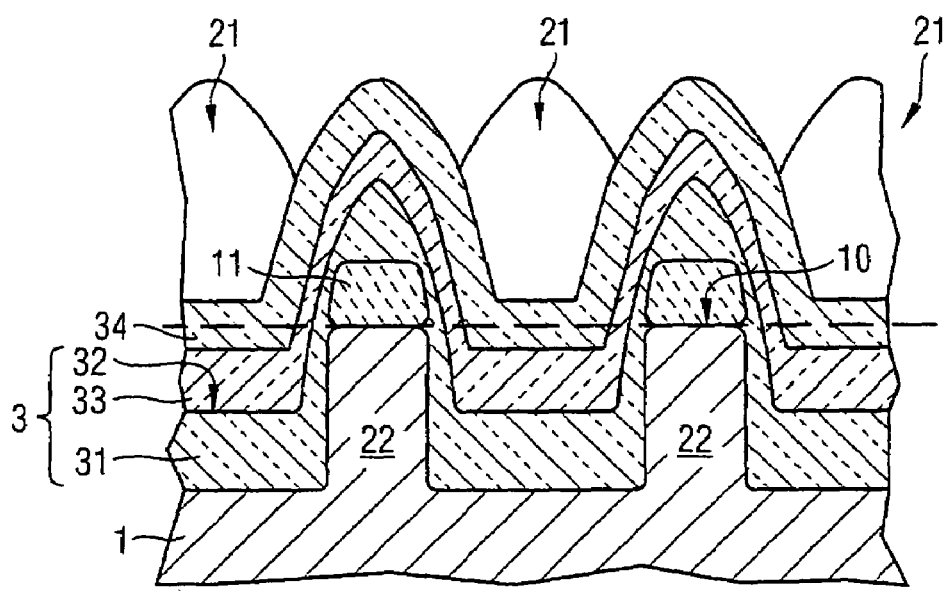
FIG. 4 illustrates a cross-section, adapted from an SEM recording and true to scale, through an insulator structure processed according to a first exemplary embodiment of a method in accordance with the invention.

The following reference numerals are used consistently throughout the specification:
1 Semiconductor substrate
10 Substrate surface
11 Protective layer
12 Nitride liner
21 Insulator trench
22 Web
3 Insulator filling
30 Facet
31 Additional layer
32 Barrier layer
33 Main layer
34 Termination layer
5 Edge
6 Defect areas
7 Active area
72 Gate conductor structure
73 Transistor In accordance with exemplary aspects of the present invention, FIG. 4 provides exemplary structure of insulator trenches 21 introduced in a semiconductor substrate 1 and webs 22 formed from the monocrystalline silicon of the semiconductor substrate 1.

Firstly, insulator trenches 21 are introduced into the semiconductor substrate 1, which is covered with a protective layer 11, for instance a pad nitride, at least in the section under consideration. In this case, webs 22 provided with residual sections of the protective layer 11 are formed between the insulator trenches 21. In the exemplary embodiment depicted, the semiconductor substrate 1 is formed exclusively from monocrystalline silicon, in a simplified illustration. In actual fact, parts of capacitor or transistor structures have already been formed in the semiconductor substrate 1, so that the insulator trenches 21, in sections, may adjoin different materials that the monocrystalline silicon of the semiconductor substrate 1.

A nondoped silicon oxide layer is first deposited as additional layer 31 onto the exemplary structure in an HDP/CVD process chamber. Afterward, the invention provides for a barrier layer 32 to be produced by means of changing the precursor materials supplied in the same HDP/CVD process chamber, said barrier layer bearing on the additional layer 31. After the production of the barrier layer 32, the main layer 33 is deposited, once again by changing the precursor materials supplied. In this exemplary embodiment, in this case the insulator trenches 21 are filled as far as an upper edge of the main layer 33 below the substrate surface 10. By once again simply changing the precursor materials supplied, a termination layer 34 is subsequently formed in situ in the HDP/CVD process chamber, and completes a filling 3 of the insulator trenches 21. The insulator structure 8 thus has the same properties as customary insulator structures for subsequent processing steps. Consequently, there is no need for any further adaptation of the subsequent processing steps to the insulator structure 8 according to the invention.

FIG. 4 reveals the insulator filling 3 in the region of the insulator trenches 31, said insulator filling being composed of the additional layer 31, the barrier layer 32, the main layer 33 and the termination layer 34. The height of the webs 22 is about 320 nm and the thickness of the protective layer 11 is 130 nm.

Figure 5:
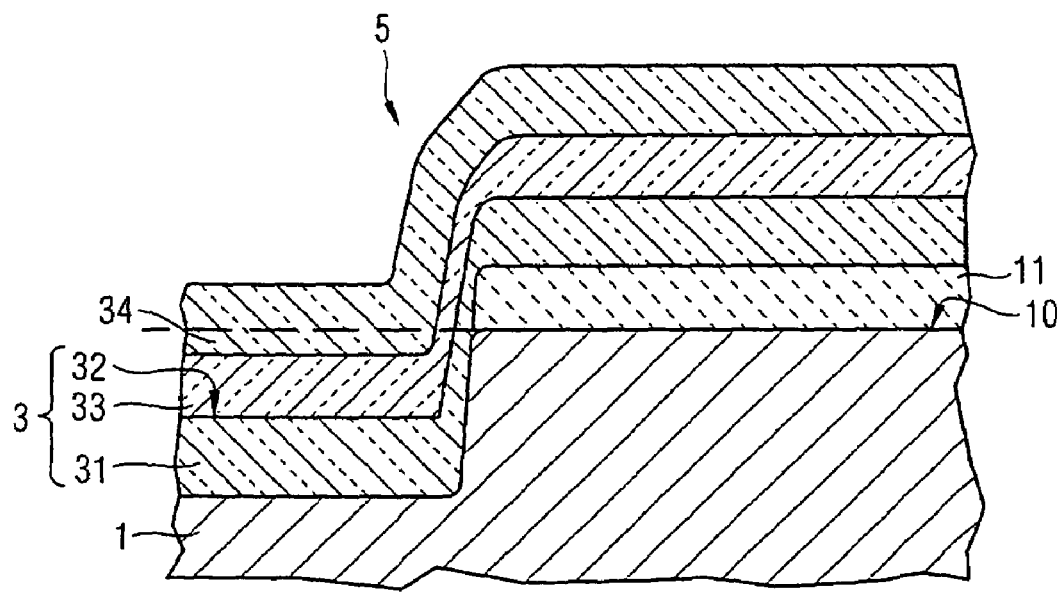
FIG. 5 illustrates a cross-section, adapted from an SEM recording and true to scale, through an insulator structure processed according to a second exemplary embodiment of the method in accordance with the invention.

FIG. 5 illustrates the construction according to the invention in the area of an edge 5. In the area of the edge 5, the barrier layer 32 does not bear on the material of the semiconductor substrate 1, but rather remains isolated from the semiconductor substrate by the additional layer 31.

Figure 6:
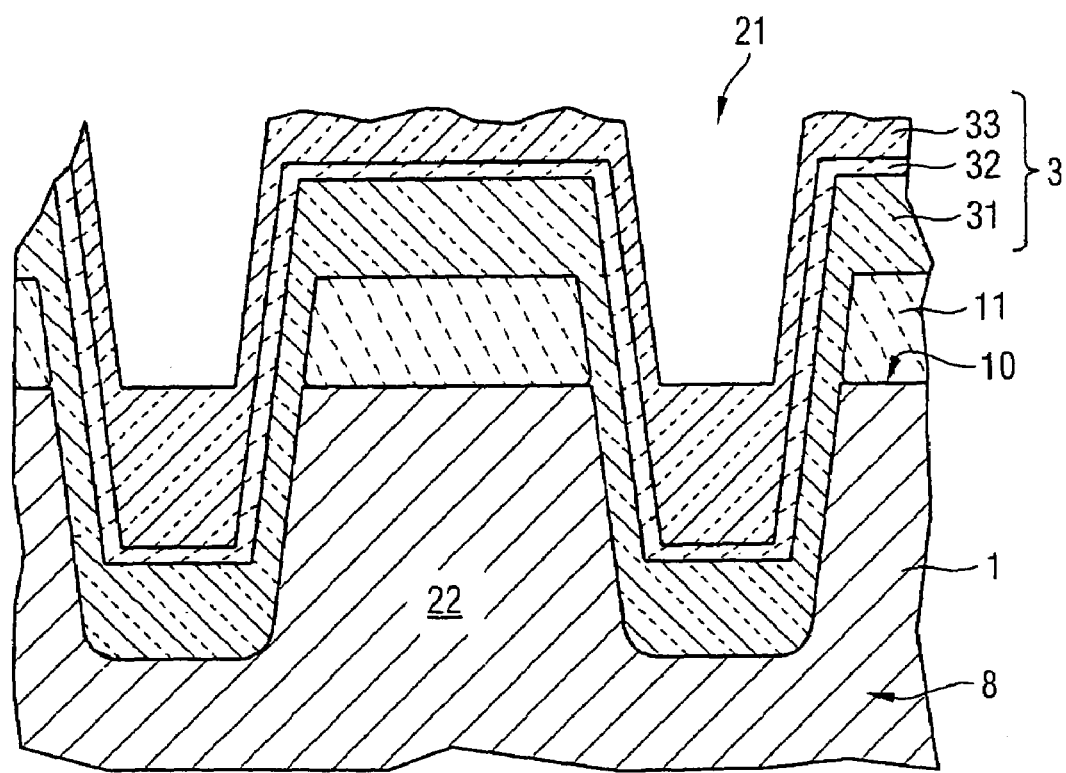
FIG. 6 illustrates a cross-section, adapted from an SEM recording and true to scale, through an insulator structure processed according to a third exemplary embodiment of the method in accordance with the invention.

An insulator structure 8 processed according to a further exemplary embodiment of the method according to the invention is illustrated in FIG. 6. The insulator trenches 21 have, at the opening, a width of about 200 nm and also a depth of about 300 nm. The webs 22 are covered by in each case approximately 150 nm thick residual sections of a protective layer 11.

Firstly, an approximately 100 nm thick additional layer 31 made of undoped silicon oxide is deposited onto the structure formed by the insulator trenches 21 and the webs 22. The deposition is effected in a suitable process chamber with the precursors silane SiH4 and oxygen O2 being supplied. Directly after the deposition of the undoped silicon oxide, by changing the precursors supplied, a thin barrier layer 32 is produced in situ in the same process chamber. Once again directly after the deposition of the barrier layer 32, a fluorine-doped silicon oxide layer is produced in situ as main layer 33 by supplying the precursors silane SiH4, oxygen O2 and nitrogen trifluoride NF3. No defect areas with low-quality oxide are discernible in an SEM recording on which FIG. 6 is modeled.

As an example, an application of a multilayer insulator filling in an HDP/CVD process chamber is achieved by provision of a source plasma, a first undoped deposition of an additional layer with a prestress according to a known type, a production of a barrier layer, a fluorine-doped deposition of a main layer, and an undoped deposition of a termination layer with a prestress.

Accordingly, aspects of the invention relate to providing a method for producing insulator structures by filling insulator trenches introduced into a semiconductor substrate, in which insulator trenches with a high aspect ratio are filled reliably and completely and a functionality of semiconductor devices that are subsequently formed in the semiconductor substrate remains ensured. Moreover, an insulator structure is provided which ensures a functional integrity of the semiconductor devices subsequently formed in the semiconductor substrate, in particular of p-channel transistors.

A method in accordance with aspects of the invention for producing insulator structures in a semiconductor substrate thus provide, an introduction of insulator trenches into the semiconductor substrate from a substrate surface and a filling of the insulator trenches with a main layer made of an additive-doped insulator material in the course of an (HDP) deposition process based on a high density plasma. A barrier layer, which blocks an interaction of the additive with the semiconductor substrate, is produced in situ before a deposition of the main layer in the course of the HDP deposition process. This is because it could initially be observed that p-channel transistors that are formed using customary technology outside the insulator structures in the area of the substrate surface of the semiconductor substrate are subject to a progressive degradation if the p-channel transistors are formed in sections which are covered with a silicon nitride liner in a conventional manner before the HDP/CVD position process. Unexpectedly, however, a significantly reduced degradation was able to be established on otherwise identically formed p-channel transistors if a barrier layer—produced according to the invention—against an outgassing of the additives was provided instead of the silicon nitride liner.

It is assumed in this case that a property of the silicon nitride or barrier layer which is critical for a degradation of the p-channel transistors has its roots in the fabrication process itself or in the proximity of the fabrication process to further process steps. The barrier layer fabricated according to an aspect of the invention differs, for instance, from known plasma nitride layers typically by virtue of the close spatial and temporal relationship with a directly ensuing deposition of silicon oxide doped with an additive.

Furthermore, a relatively complicated processing is necessary for a removal of a conventional silicon nitride liner, since it generally also requires a removal of an oxide layer connected to the silicon nitride liner, including an annealing step thus required. By contrast, in accordance with the invention, the barrier layer provided can be removed relatively simply together with the drawing-back of insulator material applied above the substrate surface.

Preferably, in the course of the HDP deposition process, directly after the production of the barrier layer, the additive-doped insulator material is deposited in a main deposition step and a main layer of the insulator structure is produced in this case.

The inventive method thus makes it possible, on the one hand, to fill insulator trenches with a high aspect ratio in a virtually ideal manner without the formation of defect areas characterized by low-quality oxide. The method makes it possible, moreover, to form p-channel transistors with a low tendency toward degradation in other sections of the semiconductor substrate. The effect observed is particularly advantageous if, in the course of the HDP deposition process, before the deposition of the barrier layer, a predeposition process is controlled with exclusion of halogens or halogen compounds and an additional layer of the insulator structure is provided in this case.

The additional layer effects, in a simple manner, an advantageous adaptation of the main layer or the barrier layer to the semiconductor substrate. A material or a composition of the additional layer is chosen such that interactions of the additional layer with the semiconductor substrate, for instance with regard to a constitution of the interface between additional layer and semiconductor substrate and also adhesion and diffusion properties are known and can be controlled in a simple manner. A further adaptation of the semiconductor substrate to the properties of the main layer or the barrier layer is unnecessary. The additional layer is preferably formed from undoped silicon oxide. The thickness of the additional layer is chosen such that the semiconductor substrate is covered by it as far as possible completely at least in the region of the insulator trenches.

In a particularly advantageous manner, the predeposition process, in the course of which the additional layer is produced, the production of the barrier layer and the main deposition process, in the course of which the main layer is produced, are controlled successively and in situ in the same process chamber. Transitions between the additional layer and the barrier layer or between the barrier layer and the main layer are not exposed to any process environment other than a controlled one, so that no undefined interface surfaces are formed at the transitions. Rather, such a method is fast and enables a high throughput of semiconductor substrates.

A halogen or a halogen compound is preferably to be taken into consideration as the additive, it being possible for the halogen to act as an etching component in the course of an HDP/CVD deposition process. In an advantageous manner, fluorine is provided as the halogen, said fluorine emerging from nitrogen trifluoride NF3 as a chemical precursor compound (precursor).

Silicon oxide is preferably provided as the insulator material, the processing of said silicon oxide being known and well-controllable in a wide spectrum.

The advantages of the method according to the invention are manifested in particular when an insulator material deposited above the substrate surface during the HDP/CVD deposition process is caused to recede as far as the substrate surface in the course of a subsequent etching process or CMP process. In known methods, in this case defect areas with low-quality oxide are uncovered within the insulator trenches, are caused to recede by the etching method and can subsequently be filled with conductive material in a disadvantageous manner. The formation of defect areas is avoided by the method according to the invention.

In particular when, after the formation of the insulator structures, p-channel transistors are formed in sections on the substrate surface outside the insulator structures, a particular advantage of the method according to the invention is that a rapid degradation of the p-channel transistors is prevented.

Silane and oxygen are then preferably supplied as chemical precursor compounds in the course of the predeposition process. Admixable inert gases in this case are Ar, He and H2.

During the main deposition process, according to a particularly preferred embodiment of the method according to the invention, silane, oxygen and nitrogen trifluoride NF3 are supplied as chemical precursor compounds. In contrast to customary methods in the course of which silicon tetrafluoride SiF4 is supplied as precursor compound for fluorine-doped silicon oxide, it is thus possible to set a fluorine proportion in the main layer of the insulator structure independently of the silicon proportion. Consequently, the additional process parameter obtained enables the properties of the fluorine-doped silicon oxide to be further adapted to process requirements.

The barrier layer is preferably formed from Si—N, Si—O—N, Si—C, Si—O—C, amorphous silicon and/or nitrided silicon oxide. In this case, a silicon nitride layer produced according to the invention has significantly better properties than conventionally produced silicon nitride liners with regard to the formation of p-channel transistors in the semiconductor substrate.

The silicon nitride layer is preferably formed using the precursor compounds N2 and SiH4, it being possible additionally to add inert gases such as Ar, He and H2.

A use of the method according to the invention is advantageous particularly when the insulator structures emerge from the filling of insulator trenches which have an aspect ratio AR>4:1.

The method according to the invention is used to produce an insulator structure according to the invention in a semiconductor substrate. The insulator structure initially comprises a main layer, which has been formed from a halogen-doped silicon oxide and has emerged from an HDP deposition process. According to the invention, the insulator structure has a barrier layer, which isolates the main layer from the semiconductor substrate. The barrier layer emerges from an HDP deposition process directly related to the formation of the main layer and prevents an interaction between halogen outgassing from the main layer and the semiconductor substrate.

In a particularly advantageous manner, an additional layer of the insulator filling is formed between the barrier layer and the semiconductor substrate.

The barrier layer preferably comprises Si—N, Si—C, Si—O—N, Si—O—C, amorphous silicon and/or nitrided silicon oxide. The materials mentioned are suitable for preventing an outgassing of a halogen, in particular of fluorine, from the doped silicon oxide. Furthermore, for the materials mentioned, suitable precursors are available for an HDP/CVD deposition process.

The insulator structure according to the invention is advantageous particularly when the insulator structure is arranged in an insulator trench whose aspect ratio AR is greater than 4:1. In the case of aspect ratios AR>4:1, insulator structures formed at least partially from halogen-doped silicon oxide are distinguished by a comparatively small number of defects.

The foregoing disclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

What is claimed is:

1. A method for producing insulator structures in a semiconductor substrate, comprising:
   introducing insulator trenches into the semiconductor substrate front a substrate surface of the semiconductor substrate; and
   partially filling the insulator trenches with a main layer made of an additive-doped insulator material in the course of an HDP deposition process based on a high density plasma,
   wherein in the course of the HDP deposition process end in a common process chamber:
   first a predeposition process in which silmne and oxygen are supplied as chemical precursor compounds is controlled with exclusion of halogens or halogen compounds and an additional layer of the insulator structure is produced,
   then a barrier layer, which blocks an interaction of the additive with the semiconductor substrate, is produced before a deposition of the main layer, and
   after production of the main layer, an auxiliary deposition process is controlled with exclusion of halogens or halogen compounds and a termination layer of the insulator structure is provided.

2. The method of claim 1, wherein material deposited above the substrate surface in the course of the HDP deposition process is caused to recede as far as the substrate surface.

3. The method of claim 1, wherein p-channel transistors are provided outside the insulator structures in the area of the substrate surface.

4. The method of claim 1, wherein the insulator trenches are provided with an aspect ratio of greater than 5:1.

5. The method of claim 1, wherein the material of the barrier layer comprises silicon and nitrogen.

6. The method of claim 1, wherein the predeposition process of the additional layer, the production of the barrier layer and a main deposition process relating to the main layer are controlled successively and in common process chamber.

7. The method of claim 6, wherein a halogen or a halogen compound is provided as the additive.

8. The method of claim 7, wherein the fluorine or a fluorine compound is provided as the halogen.

9. The method of claim 8, wherein silicon oxide is provided as the insulator material.

10. The method of claim 1, wherein silane, oxygen and $NF_3$ are supplied as chemical precursor compounds in the course of the deposition of the main layer.

11. The method of claim 10, wherein the material of the barrier layer is selected from a group consisting SIN, SION, SIC, SiOC, amorphous silicon and nitrided silicon oxide.

12. The method of claim 10, wherein the material of the barrier layer comprises SiN and wherein silane and $N_2$ are supplied as precursors for the production of the barrier layer.

13. The method of claim 1, wherein a halogen or a halogen compound is provided as the additive.

14. The method of claim 13, wherein the fluorine or a fluorine compound is provided as the halogen.

15. A method for producing a trench insulating structure, the method comprising:
   providing a semiconductor body that includes a trench;
   forming a first oxide layer in the wench by chemical vapor deposition;
   forming a barrier layer over the first oxide layer;
   forming a halogen doped insulation layer over the barrier layer, the halogen doped insulation layer formed by a high density plasma process; and
   forming an undoped oxide layer over the halogen doped insulation layer;
   wherein the first oxide layer, the barrier layer, the halogen doped insulation layer and the undoped oxide layer are formed in a single process chamber.

16. The method of claim 15, wherein the halogen doped insulation layer comprises a layer doped with fluorine or a fluorine compound.

17. The method of claim 15, wherein the material of the barrier layer is selected from a group consisting SiN, SiON, SiC, and SiOC.

18. The method of claim 15, wherein the material of the barrier layer is selected from a group consisting amorphous silicon and nitrided silicon oxide.

19. The method of claim 15, wherein the material of the barrier layer comprises SiN and wherein forming the barrier layer comprises supplying silane and $N_2$ as precursors.

20. The method of claim 15, wherein the trench has an aspect ratio of greater than 5:1.

21. A method for producing insulator structures in a semiconductor substrate, comprising:
   introducing insulator trenches into the semiconductor substrate from a substrate surface of the semiconductor substrate; and
   partially filling the insulator trenches wit a main layer made of an additive-doped insulator material in the course of an HDP deposition process based on a high density plasma,
   wherein a barrier layer, which blocks an interaction of the additive with the semiconductor substrate, is produced before a deposition of the main layer in the course of the HDP deposition process.

22. The method of claim 21, wherein material deposited above the substrate surface in the course of the HDP deposition process is caused to recede as far as the substrate surface.

23. The method of claim 21, wherein p-channel transistors are provided outside the insulator structures in the area of the substrate surface.

24. The method of claim 21, wherein the insulator trenches are provided with an aspect ratio of greater than 5:1.

25. The method of claim 21, wherein in the course of the HDP deposition process, before the deposition of the barrier layer, a predeposition process is controlled with exclusion of halogens or halogen compounds and an additional layer of the insulator structure is produced.

26. The method of claim 25, wherein the predeposition process of the additional layer, the production of the barrier layer and a main deposition process relating to the main layer are controlled successively and in a common process chamber.

27. The method of claim 21, wherein a halogen or a halogen compound is provided as the additive.

28. The method of claim 27, wherein fluorine or a fluorine compound is provided as the halogen.

29. The method of claim 27, wherein silicon oxide is provided as the insulator material.

30. The method of claim 29, wherein in the course of the HDP deposition process, after the production of the main layer, an auxiliary deposition process is controlled with exclusion of halogens or halogen compounds and a termination layer of the insulator structure is provided.

31. The method of claim 21, wherein silane and oxygen are supplied as chemical precursor compounds in the course of the predeposition process.

32. The method of claim 31, wherein silane, oxygen and $NF_3$ are supplied as chemical precursor compounds in the course of the main deposition process.

33. The method of claim 21, wherein the material of the barrier layer is selected from a group comprising Si—N, Si—O—N, Si—C, Si—O—C, amorphous silicon and nitrided silicon oxide.

34. The method of claim 33, wherein Si—N is selected as the material of the barrier layer and silane and $N_2$ are supplied as precursors for the production of the barrier layer.

* * * * *

UNITED STATES PATENT AND TRADEMARK OFFICE
CERTIFICATE OF CORRECTION

PATENT NO. : 7,052,970 B2
APPLICATION NO. : 10/798863
DATED : May 30, 2006
INVENTOR(S) : Radecker It is certified that error appears in the above-identified patent and that said Letters Patent is hereby corrected as shown below:

Column 8, line 48: delete "front" and insert --from--.
Column 8, line 54: delete "end" and insert --and--.
Column 8, line 56: delete "silmne" and insert --silane--.
Column 9, line 6: delete "stractures" and insert --structures--.
Column 9, line 26: delete "SIN, SION," and insert --SiN, SiON,--
Column 9, line 39: delete "wench" and insert --trench--.
Column 10, line 8: delete "wit" and insert --with--.

Signed and Sealed this

Eighth Day of August, 2006

JON W. DUDAS
*Director of the United States Patent and Trademark Office*